United States Patent [19]
Daniel

[11] 3,828,283
[45] Aug. 6, 1974

[54] METHOD FOR IMPROVING SEMICONDUCTOR SURFACE WAVE TRANSDUCER EFFICIENCY

[75] Inventor: Michael R. Daniel, Monroeville, Pa.

[73] Assignee: Westinghouse Electric Corporation, Pittsburgh, Pa.

[22] Filed: July 24, 1973

[21] Appl. No.: 382,265

[52] U.S. Cl. .................... 333/30 R, 310/9.8, 333/72
[58] Field of Search ....... 333/30 R, 72, 71; 330/5.5; 310/8.0, 8.2, 9.4, 9.7, 9.8

[56] References Cited

OTHER PUBLICATIONS

Gulyaev et al.–"Excitation and Amplification of Surface Acoustic Waves in Semiconductor–Piezoelectric Film Structures" in Soviet Physics–Semiconductors, Vol. 5, No. 1, July 1971; pages 66–69.

*Primary Examiner*—James W. Lawrence
*Assistant Examiner*—Marvin Nussbaum
*Attorney, Agent, or Firm*—D. Schron

[57] ABSTRACT

An improved semiconductor surface wave transducer and method for improving the efficiency of a surface wave transducer comprising a semiconductor substrate upon which is deposited a thin piezoelectric film which has deposited or fabricated thereon at least one interdigital electrode grid. The method comprises increasing the carrier concentration of the semiconductor substrate to provide at least a plane of electrical conductivity underlying the piezoelectric film and electrode grid having a resistivity of less than 1.0 ohms-cm at 20°C.

10 Claims, 2 Drawing Figures

METHOD FOR IMPROVING SEMICONDUCTOR SURFACE WAVE TRANSDUCER EFFICIENCY

GOVERNMENT CONTRACT

The invention herein described was made in the course of or under Contract N00014-69-C-0118 or subcontract thereunder with the Department of the Navy.

FIELD OF THE INVENTION

The present invention relates to a method for increasing the efficiency of a surface wave transducer having a semiconductor substrate and to an improved efficiency semiconductor surface wave transducer.

BACKGROUND OF THE INVENTION

Elastic surface waves have been well known for over a century. These waves were first investigated by Rayleigh and the most frequently used wave is known as the Rayleigh wave. Generally, two displacement components are required for generating Rayleigh waves, a shear displacement normal to the surface of a solid on which it is to be propogated, and a compressional displacement parallel to both the surface and the wave normal. When both displacements are spatially generated 90° apart, a Rayleigh wave is propogated along the surface of the medium.

The efficiency of conversion from electromagnetic to mechanical energy depends upon the piezoelectric, dielectric and elastic properties of the propogation mechanism. Additionally, the amount of power available for conversion is determined by the impedance match between the transducer and the source of electromagnetic power.

One means for generating elastic surface waves comprises a piezoelectric film deposited on a substrate or a piezoelectric crystal which has positioned thereon a pair of interdigital electrode comb grids. An alternating electric signal is supplied across the grids to provide electric field components, one component being normal to the surface of the piezoelectric material and another parallel to the surface.

The interdigital grid becomes resonant at the frequency for which the spacing between the centers of adjacent grid fingers is ½ an elastic surface wavelength. Under these conditions, the elastic wave propogates in phase with the electric field reversals resulting in Rayleigh waves which propogate in both directions along the normal to the interdigital grid. For a more complete explanation of surface wave generation, see 9 Ultrasonics 35 (1971). See also, Hickernell, Piezoelectric Film Surface Wave Transducers, Vol. 4, Acoustic Surface Wave & Acousto-Optic Devices, p. 31 (Optosonic Press 1971).

Surface wave transducers for nonpiezoelectric materials have also been disclosed which have efficiencies comparable to interdigital electrode transducers on good piezoelectric surfaces, U.S. Pat. No. 3,665,225.

In microwave transducer devices, for example, it is well known that it is important to minimize the insertion losses introduced by the transducer to the lowest possible value. One of the causes for high insertion losses is the electrical mismatch such as between the impedance of the external transmission line and the low electrical radiation resistance of the thin film transducer. In thin film bulk wave transducers insertion losses have been reduced by electrically connecting upper and lower interdigital grids in series to provide a very low capacitance and high radiation resistance device, U.S. Pat. No. 3,689,784. This device, however, is not suitable for generating surface waves, and particularly surface waves on a transducer having a semiconductor substrate.

Surface wave transducers utilizing a semiconductor substrate have recently been used in large scale integrated circuits. For example, the surface wave transducers may function in delay lines, and their size is substantially smaller than equivalent electrical or electromagnetic circuits. Also provided within the semiconductor substrate may be various semiconductor devices, such as a transistor, which may be electrically connected to the electrode grid of the transducer. Accordingly, it is extremely desirable to achieve the maximum possible efficiencies in these devices.

Accordingly, it is an object of the present invention to provide a method for reducing the insertion losses of a surface wave transducer comprising a semiconductor substrate upon which is deposited a thin piezoelectric film adapted to carry an interdigital electrode grid. It is a further object of the present invention to provide a surface wave transducer having a semiconductor substrate with improved efficiency.

SUMMARY OF THE INVENTION

The present invention comprises a method for increasing the efficiency of a semiconductor surface wave transducer. The method of the invention comprises increasing the semiconductor carrier concentration in an area adjacent to and underlying the electrode grid/piezoelectric film to provide an area or plane of conductivity.

Preferably, the localized plane of conductivity may conform to the configuration or pattern established by the interdigital grid. This, for example, may be achieved by diffusing the desired dopant through a photoresist mask similar to that used for depositing the electrode grid onto the piezoelectric film. Moreover, while it is preferred that only a localized plane of conductivity be provided in the substrate, it is clear that the initial carrier concentration of the entire substrate can be made conductive. In practical application this is not done, since the substrate may be selectively doped to contain other devices such as transistors, diodes and other circuit elements of an integrated circuit. For example, in a delay line using a pair of grid/piezoelectric films functioning as a transmitter and receiver of surface waves, a transistor may be incorporated in the substrate to amplify the electrical signal from the receiver to accommodate any losses in the line. Initially, high levels of dopant are therefore not beneficial or desirable. Accordingly, since the semiconductor surface wave transducers are typically used for or with large scale integrated circuits, localized conductivity is preferred.

Other advantages of the present invention will become apparent from a perusal of the following detailed description taken in connection with the accompanying drawings.

DESCRIPTION OF THE INVENTION

The present invention comprises a method and means for improving the efficiency of surface wave transducers having semiconductor substrates. Usually these transducers comprise an electrode structure deposited upon a thin piezoelectric film which has been positioned or deposited on the surface of a semiconductor substrate.

The semiconductor substrate is typically silicon, but other semiconductor materials have been used or proposed such as germanium, and the like.

The piezoelectric film is typically a material such as ZnO, ZnS, CdS and the like which is deposited over or on the substrate. The electrode, typically an interdigital grid is formed or fabricated on the piezoelectric film by evaporating a metal such as gold or aluminum through a photoresist mask or by use of standard photolithographic techniques.

It has been found that where the semiconductor substrate is provided with a carrier concentration sufficient to provide a plane of conductivity underlying the area bounded by the piezoelectric film and electrode grid improved efficiency is obtained. The conductivity, in terms of resistivity is less than 1.0 ohm-cm at 20°C and, preferably, between 0.05 and 0.001 ohm-cm. The plane of conductivity reduces both matched and unmatched insertion losses. Furthermore, the normal electrical fields generated through the piezoelectric films are greatly strengthened to provide stronger mechanical waves.

Figure 1:
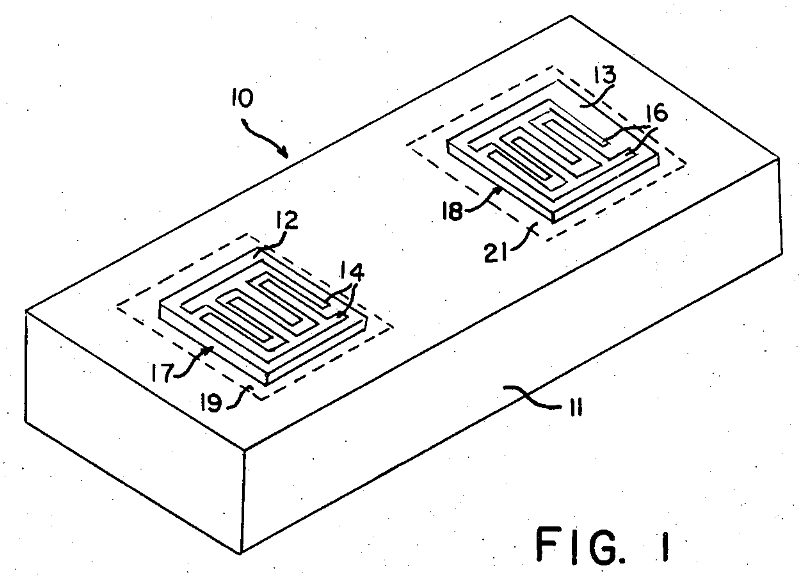
FIG. 1 is an enlarged isometric view of a semiconductor surface wave transducer utilized as a delay line for large scale integrated circuits and having localized areas of conductivity adjacent each grid/piezoelectric film.

Referring to FIG. 1, a semiconductor surface wave transducer is shown as an illustrative embodiment of the present invention. In this embodiment, a surface wave transducer delay line device 10 comprising a semiconductor substrate 11, such as silicon, includes first and second piezoelectric films 12 and 13 deposited thereon. Thin piezoelectric films 12 and 13 of ZnO, for example, typically have a ratio of film thickness to wavelength of less than 0.1 and preferably about 0.05. The piezoelectric film may be deposited by conventional R.F. sputtering techniques or other deposition techniques.

Deposited on first and second films 12 and 13 are first and second interdigital electrode grids 14 and 16, respectively. Grids 14 and 16 may be evaporated onto the respective films through a photoresist mask or deposited photolithographically to provide a mechanically unitized structure. Electrode grids 14 and 16 each comprise a pair of interdigitated electrode combs, one of which is connected to a ground.

In delay line applications, the first transducer 17 comprising first piezoelectric film 12 and first electrode grid 14 functions as a transmitter of surface waves. An electrical input signal is impressed across the grid combs and a surface wave generated across the surface of substrate 11. Second transducer 18, comprising second piezoelectric film 13 and second electrode grid 16, functions as a receiver of the surface waves and produces an electrical output signal which can thereafter be processed or otherwise utilized.

Underlying first and second transducers 17 and 18 are conductive planes 19 and 21, respectively, comprising planes of increased carrier concentration in semiconductor substrate 11. Conductive planes 19 and 21 are preferably made by diffusing the desired carrier or dopant through the window used in depositing the piezoelectric film onto substrate 11. Conventional state of the art diffusion techniques are suitable for use in providing the conductive plane of the present invention. Alternatively, a photoresist mask similar to that used in the deposition of the interdigital electrode can be used to provide a plane of conductivity in the substrate corresponding to the grid pattern. Thus, using standard diffusion techniques in a silicon substrate, for example, a p-type carrier concentration of from about $10^{18}$ to about $5(10)^{20}$ $cm^{-3}$ and an n-type carrier concentration of about $10^{17}$ to about $5(10)^{20}$ $cm^{-3}$ are preferred.

By providing the semiconductor substrate with a plane of conductivity underlying the region of the transducer, both electrical and acoustical elements of the device are enhanced. In particular, the conductive plane increases the capacitance of the transducer as well as increases the normal electric field component and thus the compressional strain component of the surface wave. Accordingly, this component carries more energy and the transduction efficiency is improved.

Figure 2:
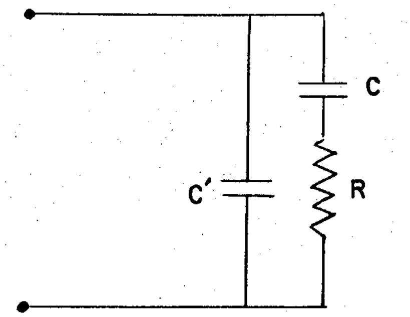
FIG. 2 is an equivalent circuit for a transducer at resonance.

Further, the effective radiation resistance is increased. With reference to FIG. 2, an interdigital grid transducer at resonance has an equivalent circuit comprising radiation resistance R, series inter-electrode capacitance C and stray shunt capacitance (from the wiring and connectors) C′. Real impedance R′ is equal to $R/(1 + C'/C)^2$ and the reactive impedance X′ is equal to $-1/\omega(C + C')$ where $1/\omega C$ and $1/\omega C'$ are generally greater than R. Thus, increasing inter-electrode capacitance C improves the matching to a coaxial transmission line by increasing effective radiation resistance R′ and decreasing reactive impedance.

While not preferred, the conductive plane may be grounded to the grounded grid electrode. The efficiency of the transducer is increased, but the insertion loss is about 3dB greater than with the ungrounded conductive plane because of the generation of some undesired bulk waves.

An example of the improved efficiency by the method of the present invention is seen by way of comparison with a conventional transducer comprising a semiconductor substrate of silicon having a 3$\mu$ ZnO piezoelectric film deposited thereon and a simple two grid electrode positioned on the film. The conventional silicon substrate had a p-type carrier (boron) concentration of $10^{15}$ $cm^{-3}$. The transducer had a 75 dB unmatched insertion loss with a surface wave generated at 45 MHz. However, when the carrier concentration of the silicon substrate was increased to $10^{19}$ $cm^{-3}$ and the substrate grounded, the unmatched insertion loss was reduced to 41 dB.

Moreover, increasing the carrier concentration of the semiconductor substrate permits more efficient generation of third harmonics which allows standard optical photoresist techniques to be employed in the manufacture of interdigital grids for driving a third harmonic to launch surface waves in the microwave region.

While particularly preferred embodiments of the invention have been described, it may otherwise be embodied within the scope of the appended claims.

What is claimed is:

1. A method for increasing the efficiency of a surface wave transducer having a semiconductor substrate including thereon at least one thin piezoelectric film and at least one electrode grid deposited on said film, said method comprising:

increasing the carrier concentration of the semiconductor substrate to provide at least a plane of conductivity underlying the piezoelectric film having a resistivity of less than 1.0 ohm-cm.

2. A method as set forth in claim 1 wherein said carrier concentration is increased in a plane underlying said film.

3. A method as set forth in claim 1 wherein said carrier concentration is increased in a plane underlying said film and having a configuration conforming to the configuration of the electrode grid.

4. A method as set forth in claim 1 wherein said resistivity is from about 0.05 to 0.001 ohm-cm.

5. A method as set forth in claim 1 including the step of grounding said plane of conductivity.

6. In a surface wave transducer device having a semiconductor substrate including thereon at least one thin piezoelectric film and at least one electrode grid deposited on said film, the improvement comprising:

said semiconductor substrate having an increased carrier concentration sufficient to provide at least a plane of conductivity underlying said piezoelectric film having a resistivity of less than 1.0 ohm-cm.

7. An improvement as set forth in claim 6 wherein said resistivity is between about 0.05 and 0.001 ohm-cm.

8. An improvement as set forth in claim 6 wherein said carrier concentration is between $10^{18}$ and $5(10)^{20}$ $cm^{-3}$ for a p-type carrier and from $10^{17}$ to $5(10)^{20}$ $cm^{-3}$ for an n-type carrier.

9. An improvement as set forth in claim 6 wherein said plane of conductivity has a configuration conforming to the configuration of said electrode grid.

10. An improvement as set forth in claim 6 wherein said plane of conductivity is grounded.

* * * * *